United States Patent
Kang et al.

(10) Patent No.: US 9,270,285 B2
(45) Date of Patent: Feb. 23, 2016

(54) SEMICONDUCTOR CHIPS AND SEMICONDUCTOR SYSTEMS FOR EXECUTING A TEST MODE

(71) Applicant: SK hynix Inc., Icheon-si Gyeonggi-do (KR)

(72) Inventors: Tae Wook Kang, Seoul (KR); Kwang Jin Na, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 260 days.

(21) Appl. No.: 13/944,345

(22) Filed: Jul. 17, 2013

(65) Prior Publication Data

US 2014/0056085 A1 Feb. 27, 2014

(30) Foreign Application Priority Data

Aug. 23, 2012 (KR) .................. 10-2012-0092525

(51) Int. Cl.
- G11C 8/00 (2006.01)
- H03L 7/08 (2006.01)
- G11C 7/22 (2006.01)
- G11C 29/12 (2006.01)

(52) U.S. Cl.
CPC .............. *H03L 7/0802* (2013.01); *G11C 7/222* (2013.01); *G11C 29/12015* (2013.01)

(58) Field of Classification Search
CPC . H03L 7/0802; G11C 29/12015; G11C 7/222
USPC ............... 365/189.02, 189.04, 189.15, 233.1, 365/233.11, 233.12, 233.5, 201
See application file for complete search history.

(56) References Cited

U.S. PATENT DOCUMENTS 6,489,819 B1 * 12/2002 Kono ..................... G11C 29/14
327/141
2004/0179421 A1 * 9/2004 Kim ..................... G11C 7/1072
365/233.1

FOREIGN PATENT DOCUMENTS

KR 101083674 B1 11/2011

* cited by examiner

*Primary Examiner* — Tha-O H Bui
(74) *Attorney, Agent, or Firm* — William Park & Associates Ltd.

(57) ABSTRACT

Semiconductor chips are provided. The semiconductor chip includes a selection phase clock generator and a data input/output portion. The selection phase clock generator is configured to receive an external clock signal and an inversed external clock signal to generate phase clock signals, configured to receive a first external test clock signal and a second external test clock signal to generate test phase clock signals, and configured to output the phase clock signals or the test phase clock signals as selection phase clock signals in response to a test mode signal.

26 Claims, 6 Drawing Sheets

SEMICONDUCTOR CHIPS AND SEMICONDUCTOR SYSTEMS FOR EXECUTING A TEST MODE

CROSS-REFERENCE TO RELATED APPLICATION

The present application claims priority under 35 U.S.C 119(a) to Korean Application No. 10-2012-0092525, filed on Aug. 23, 2012, in the Korean Intellectual Property Office, which is incorporated herein by reference in its entirety as set forth in full.

BACKGROUND

Embodiments of the present disclosure generally relate to semiconductor chips and semiconductor systems including the same.

As semiconductor systems are developed for high speed operations, it is becoming increasingly important to realize high data transmission rates between the semiconductor chips constituting a semiconductor system. In response, various pre-fetch schemes have been proposed for realizing high data transmission rates. The pre-fetch scheme may correspond to a design technique that latches data inputted in series and then outputs the latched data in parallel. The pre-fetch scheme may provide the high data transmission rates as well as the data having a high bandwidth. To obtain a parallel data, the clock signals having different phases, for example, multi-phase clock signals are required. The multi-phase clock signals may be generated in the semiconductor chips, and the multi-phase clock signals are used for inputting or outputting of the data.

In general, the multi-phase clock signals may be generated using an internal clock signal having a frequency, which is twice that of an external clock signal, and the internal clock signal may be generated using a phase locked loop (PLL) circuit.

However, the PLL circuit requires a large area in the circuit layout of the semiconductor chip and causes undesirably large current consumption. Thus, the semiconductor chip including the PLL circuit may suffer from high integration density and high power consumption. Further, the PLL circuit may require a relatively long locking time to generate the internal clock signal having a frequency which is twice that of the external clock signal.

SUMMARY

Various embodiments are directed to semiconductor chips and semiconductor systems including the same.

According to an embodiment of the present invention, a semiconductor chip includes a selection phase clock generator and a data input/output portion. The selection phase clock generator is configured to receive an external clock signal and an inversed external clock signal to generate phase clock signals, configured to receive a first external test clock signal and a second external test clock signal to generate test phase clock signals, and configured to output the phase clock signals or the test phase clock signals as selection phase clock signals in response to a test mode signal. The data input/output portion is configured to receive and output data in synchronization with the selection phase clock signals.

According to an embodiment of the present invention, a semiconductor system includes a first semiconductor chip and a second semiconductor chip. The first semiconductor chip is configured to generate a command signal, an address signal, a first external clock signal, a first inversed external clock signal, a second external clock signal, a second inversed external clock signal, a first external test clock signal and a second external test clock signal. The second semiconductor chip is configured to generate selection phase clock signals in response to the first and second external test clock signals in a test mode and configured to receive and output data in synchronization with the selection phase clock signals. The second external test clock signal has the same frequency and phase as the first external clock signal. In addition, the second external test clock signal has a phase difference of 90 degrees with respect to the first external test clock signal.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Various embodiments of the inventive concept will be described hereinafter with reference to the accompanying drawings. However, the embodiments described herein are for illustrative purposes only and are not intended to limit the scope of the inventive concept.

Figure 1:
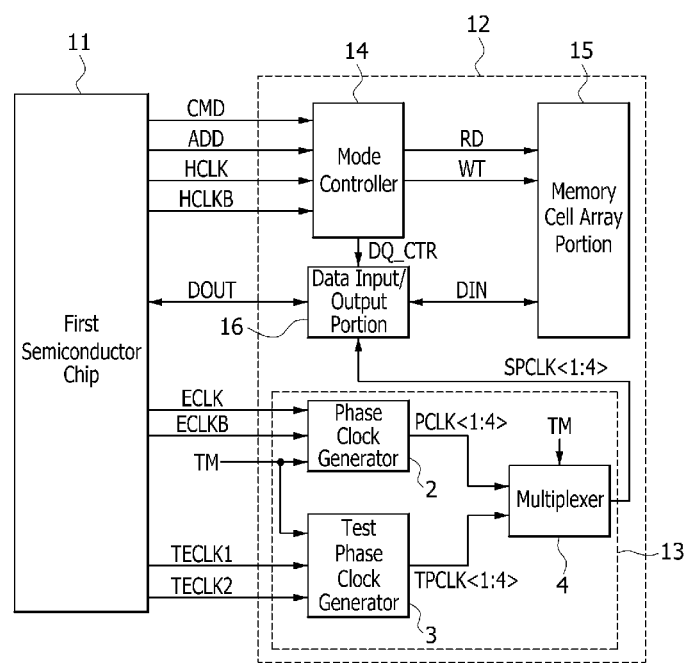
FIG. 1 is a block diagram illustrating a configuration of a semiconductor system according to an embodiment of the present invention.

FIG. 1 is a block diagram illustrating a configuration of a semiconductor system according to an embodiment of the present invention.

As illustrated in FIG. 1, a semiconductor system according to an embodiment of the present invention may be configured to include a first semiconductor chip 11 and a second semiconductor chip 12.

The first semiconductor chip 11 may generate: a command signal CMD, an address signal ADD, a first external clock signal HCLK, a first inversed external clock signal HCLKB, a second external clock signal ECLK, a second inversed external clock signal ECLKB, a first external test clock signal TECLK1 and a second external test clock signal TECLK2. The command signal CMD, the address signal ADD, the first external clock signal HCLK, the first inversed external clock signal HCLKB, the second external clock signal ECLK, the second inversed external clock signal ECLKB, the first external test clock signal TECLK1 and the second external test clock signal TECLK2 generated from the first semiconductor chip 11 may be applied to the second semiconductor chip 12. The first inversed external clock signal HCLKB may correspond to a complementary signal of the first external clock signal HCLK. Accordingly, there may be a phase difference of 180 degrees between the first external clock signal HCLK and the first inversed external clock signal HCLKB. The second external clock signal ECLK may have a frequency which is twice that of the first external clock signal HCLK. The second inversed external clock signal ECLKB may correspond to a complementary signal of the second external clock signal ECLK. Thus, there may be a phase difference of 180 degrees between the second external clock signal ECLK and the second inversed external clock signal ECLKB. The first external test clock signal TECLK1 may have the same phase and frequency as the first external clock signal HCLK. The second external test clock signal TECLK2 may precede the first external test clock signal TECLK1 by a phase of 90 degrees or vice versa. That is, there may be a phase difference of 90 degrees between the first external test clock signal TECLK1 and the second external test clock signal TECLK2. In an embodiment of the present invention, the first semiconductor chip 11 may be configured to have a circuit block which can provide control signals, such as, the command signal CMD, the address signal ADD and external clock, and a circuit block which can provide test clock signals. That is, the first semiconductor chip 11 may include a memory controller or a test apparatus.

The second semiconductor chip 12 may be configured to include a selection phase clock generator 13, a mode controller 14, a memory cell array portion 15 and a data input/output (I/O) portion 16. The selection phase clock generator 13 may generate first to fourth selection phase clock signals SPCLK<1:4> in response to the first and second external test clock signals TECLK1 and TECLK2 in a test mode. Alternatively, the selection phase clock generator 13 may generate the first to fourth selection phase clock signals SPCLK<1:4> in response to the second external clock signal ECLK and the second inversed external clock signal ECLKB out of the test mode. When the selection phase clock generator 13 operates in the test mode, a test mode signal TM may be enabled. The test mode signal TM may be provided from the first semiconductor chip 11. Alternatively, the test mode signal TM may be internally provided from the second semiconductor chip 12.

The mode controller 14 may receive the command signal CMD and the address signal ADD in synchronization with the first external clock signal HCLK and the first inversed external clock signal HCLKB to generate a read signal RD, a write signal WT and a data control signal DQ_CTR. The read signal RD may be enabled for a read operation, and the write signal WT may be enabled for a write operation. The read signal RD and the write signal WT may be provided to the memory cell array portion 15. Further, the data control signal DQ_CTR may be a signal for controlling input or output of data. Internal data DIN may be stored in the memory cell array portion 15 when the write signal WT is enabled, and the internal data DIN stored in the memory cell array portion 15 may be outputted when the read signal RD is enabled. The data input/output (I/O) portion 16 may receive external data DOUT outputted from the first semiconductor chip 11 in synchronization with the first to fourth selection phase clock signals SPCLK<1:4> to generate the internal data DIN, according to the data control signal DQ_CTR. Alternatively, the data input/output (I/O) portion 16 may receive the internal data DIN outputted from the memory cell array portion 15 in synchronization with the first to fourth selection phase clock signals SPCLK<1:4> to generate the external data DOUT, according to the data control signal DQ_CTR.

The selection phase clock generator 13 may be configured to include a phase clock generator 2, a test phase clock generator 3 and a multiplexer 4. The phase clock generator 2 may generate first to fourth phase clock signals PCLK<1:4> in response to the second external clock signal ECLK and the second inversed external clock signal ECLKB when the test mode signal TM is disabled. The test phase clock generator 3 may generate first to fourth test phase clock signals TPCLK<1:4> in response to the first and second external test clock signals TECLK1 and TECLK2 when the test mode signal TM is enabled. The multiplexer 4 may output the first to fourth test phase clock signals TPCLK<1:4> as the first to fourth selection phase clock signals SPCLK<1:4> when the test mode signal TM is enabled. Alternately, the multiplexer 4 may output the first to fourth phase clock signals PCLK<1:4> as the first to fourth selection phase clock signals SPCLK<1:4> when the test mode signal TM is disabled.

Figure 2:
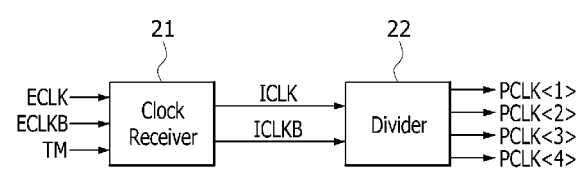
FIG. 2 is a block diagram illustrating an example of a phase clock generator included in the semiconductor system of FIG. 1.
Figure 4:
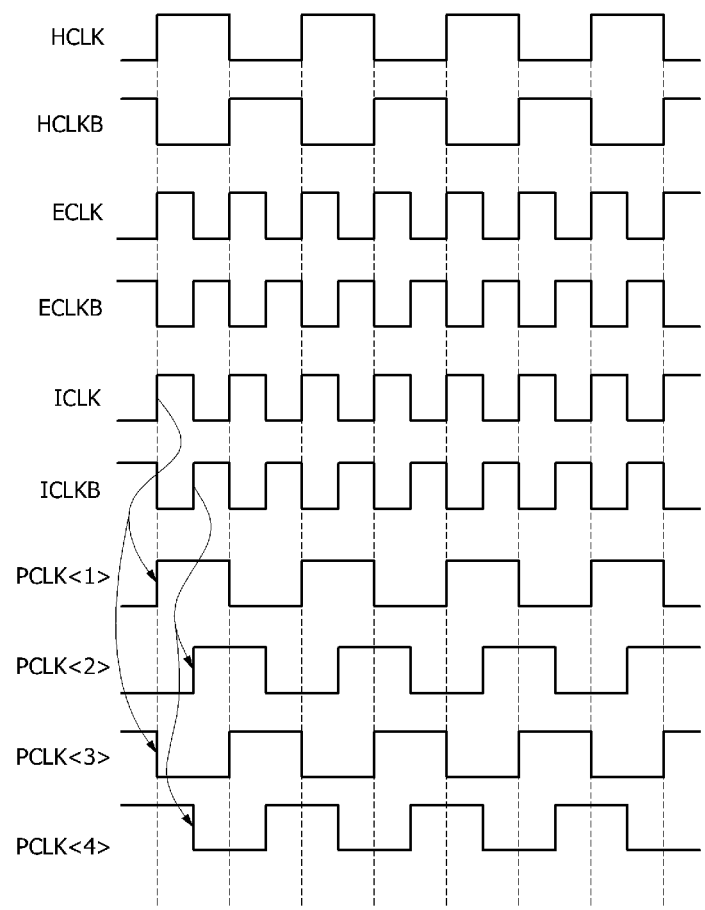
FIG. 4 is a timing diagram illustrating an operation of the phase clock generator shown in FIG. 2.

FIG. 2 is a block diagram illustrating an example of the phase clock generator included in the semiconductor system of FIG. 1, and FIG. 4 is a timing diagram illustrating an operation of the phase clock generator shown in FIG. 2.

As illustrated in FIGS. 2 and 4, the phase clock generator 2 may be configured to include a clock receiver 21 and a divider 22. The clock receiver 21 may receive the second external clock signal ECLK and the second inversed external clock signal ECLKB to generate an internal clock signal ICLK and an inversed internal clock signal ICLKB when the test mode signal TM is disabled. The internal clock signal ICLK may be generated by buffering the second external clock signal ECLK. Thus, the internal clock signal ICLK may have the same frequency and phase as the second external clock signal ECLK. Similarly, the inversed internal clock signal ICLKB may be generated by buffering the second inversed external clock signal ECLKB. Thus, the inversed internal clock signal ICLKB may have the same frequency and phase as the second inversed external clock signal ECLKB. The divider 22 may receive the internal clock signal ICLK and the inversed internal clock signal ICLKB. The divider 22 may divide the frequency of the internal clock signal ICLK and the inversed internal clock signal ICLKB to generate the first to fourth phase clock signals PCLK<1:4>. The first to fourth phase clock signals PCLK<1:4> may be generated to be 2-division signals of the internal clock signal ICLK and the inversed internal clock signal ICLKB. That is, the first to fourth phase clock signals PCLK<1:4> may be generated to have a frequency which is half that of the internal clock signal ICLK and the inversed internal clock signal ICLKB. Further, there may be a phase difference of 90 degrees between the first and second phase clock signals PCLK<1:2>, between the second and third phase clock signals PCLK<2:3>, between the third and fourth phase clock signals PCLK<3:4>, and between the fourth and first phase clock signals PCLK<4:1>. That is, a phase of the second phase clock signal PCLK<2> may be 90 degrees later than that of the first phase clock signal PCLK<1>, a phase of the third phase clock signal PCLK<3> may be 90 degrees later than that of the second phase clock signal PCLK<2>, and a phase of the fourth phase clock signal PCLK<4> may be 90 degrees later than that of the third phase clock signal PCLK<3>.

Figure 3:
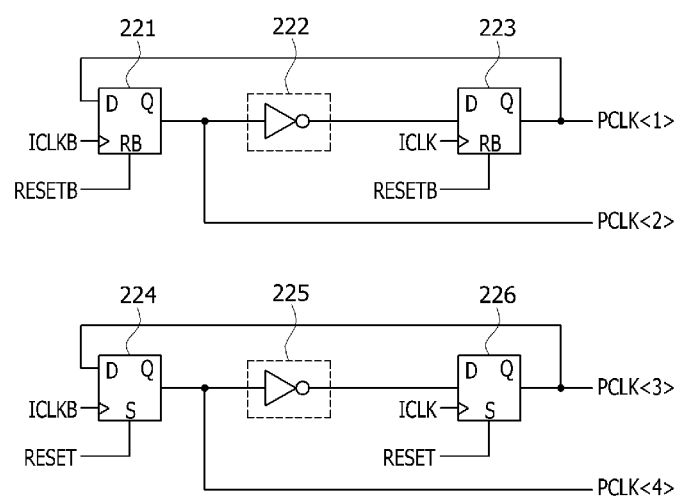
FIG. 3 is a block diagram illustrating an example of a divider included in the phase clock generator of FIG. 2.

FIG. 3 is a block diagram illustrating an example of the divider included in the phase clock generator of FIG. 2.

As illustrated in FIG. 3, the divider 22 may be configured to include a first latch portion 221, a first buffer 222, a second latch portion 223, a third latch portion 224, a second buffer 225 and a fourth latch portion 226. The first latch portion 221 may latch the first phase clock signal PCLK<1> in synchronization with a rising edge of the inversed internal clock signal ICLKB to output the second phase clock signal PCLK<2>. The first latch portion 221 may be initialized to output a logic "low" level signal in response to an inversed reset signal RESETB having a logic "low" level, which is inputted through a reset signal input terminal RB thereof during an initialization operation. The first buffer 222 may inversely buffer an output signal of the first latch portion 221 and may output the inversely buffered signal. For example, the first buffer 222 may be an inverter. The second latch portion 223 may latch an output signal of the first buffer 222 in synchronization with a rising edge of the internal clock signal ICLK to output the first phase clock signal PCLK<1>. The second latch portion 223 may be initialized to output a logic "low" level signal in response to the inversed reset signal RESETB having a logic "low" level, which is inputted through a reset signal input terminal RB thereof during the initialization operation.

The third latch portion 224 may latch the third phase clock signal PCLK<3> in synchronization with a rising edge of the inversed internal clock signal ICLKB to output the fourth phase clock signal PCLK<4>. The third latch portion 224 may be initialized to output a logic "high" level signal in response to a reset signal RESET having a logic "high" level, which is inputted through a set signal input terminal S thereof during the initialization operation. The second buffer 225 may inversely buffer an output signal of the third latch portion 224 and may output the inversely buffered signal. The second buffer 225 may be an inverter. The fourth latch portion 226 may latch an output signal of the second buffer 225 in synchronization with a rising edge of the internal clock signal ICLK to output the third phase clock signal PCLK<3>. The fourth latch portion 226 may be initialized to output a logic "high" level signal in response to the reset signal RESET having a logic "high" level, which is inputted through a set signal input terminal S thereof during the initialization operation.

As described above, during the initialization operation of the divider 22, the first and second latch portions 221 and 223 may be initialized to output logic "low" level signals in response to the inversed reset signal RESETB having a logic "low" level, and the third and fourth latch portions 224 and 226 may be initialized to output logic "high" level signals in response to the reset signal RESET having a logic "high" level. After the initialization operation, the second and fourth latch portions 223 and 226 may latch and output the input signals thereof in synchronization with a rising edge of the internal clock signal ICLK, and the first and third latch portions 221 and 224 may latch and output the input signals thereof in synchronization with a rising edge of the inversed internal clock signal ICLKB. Thus, the first to fourth phase clock signals PCLK<1:4> outputted from the divider 22 may be generated to be 2-division signals having a period which is twice that of the internal clock signal ICLK and the inversed internal clock signal ICLKB, and there may be a phase difference of 90 degrees between the first and second phase clock signals PCLK<1:2>, between the second and third phase clock signals PCLK<2:3>, between the third and fourth phase clock signals PCLK<3:4>, and between the fourth and first phase clock signals PCLK<4:1>, respectively. The operation of the phase clock generator 2 will be described more fully hereinafter with reference again to FIG. 4.

Referring again to FIG. 4, the second external clock signal ECLK, which is generated from the first semiconductor chip 11 and applied to the second semiconductor chip 12, may have a frequency which is twice that of the first external clock signal HCLK. The second inversed external clock signal ECLKB, which is generated from the first semiconductor chip 11 and applied to the second semiconductor chip 12, may have a frequency which is twice that of the first inversed external clock signal HCLKB. The internal clock signal ICLK generated from the clock receiver 21 may have the same frequency and phase as the second external clock signal ECLK. The inversed internal clock signal ICLKB generated from the clock receiver 21 may have the same frequency and phase as the second inversed external clock signal ECLKB. The divider 22 may divide the frequency of the internal clock signal ICLK and the inversed internal clock signal ICLKB to generate the first to fourth phase clock signals PCLK<1:4>. The first to fourth phase clock signals PCLK<1:4> may be 2-division signals of the internal clock signal ICLK and the inversed internal clock signal ICLKB. That is, the first to fourth phase clock signals PCLK<1:4> may have periods which are twice that of the internal clock signal ICLK and the inversed internal clock signal ICLKB.

In more detail, the levels of the first and third phase clock signals PCLK<1> and PCLK<3> may be transited in synchronization with a rising edge of the internal clock signal ICLK, and the levels of the second and fourth phase clock signals PCLK<2> and PCLK<4> may be transited in synchronization with a rising edge of the inversed internal clock signal ICLKB. Further, the third phase clock signal PCLK<3> may correspond to an inversed signal (or a complementary signal) of the first phase clock signal PCLK<1> and may have a phase difference of 180 degrees with respect to the first phase clock signal PCLK<1>, and the fourth phase clock signal PCLK<4> may correspond to an inversed signal (or a complementary signal) of the second phase clock signal PCLK<2> and may have a phase difference of 180 degrees with respect to the second phase clock signal PCLK<2>. Accordingly, a phase of the second phase clock signal PCLK<2> may be 90 degrees later than that of the first phase clock signal PCLK<1>, a phase of the third phase clock signal PCLK<3> may be 90 degrees later than that of the second phase clock signal PCLK<2>, and a phase of the fourth phase clock signal PCLK<4> may be 90 degrees later than that of the third phase clock signal PCLK<3>.

Figure 5:
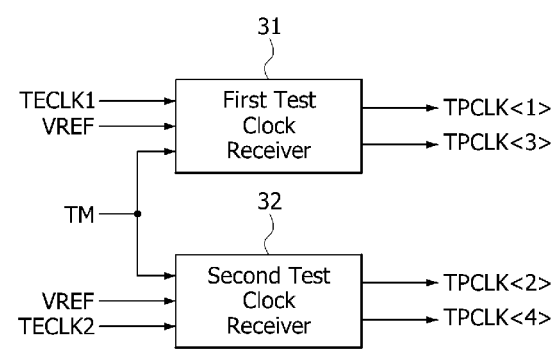
FIG. 5 is a block diagram illustrating an example of a test phase clock generator included in the semiconductor system of FIG. 1.
Figure 6:
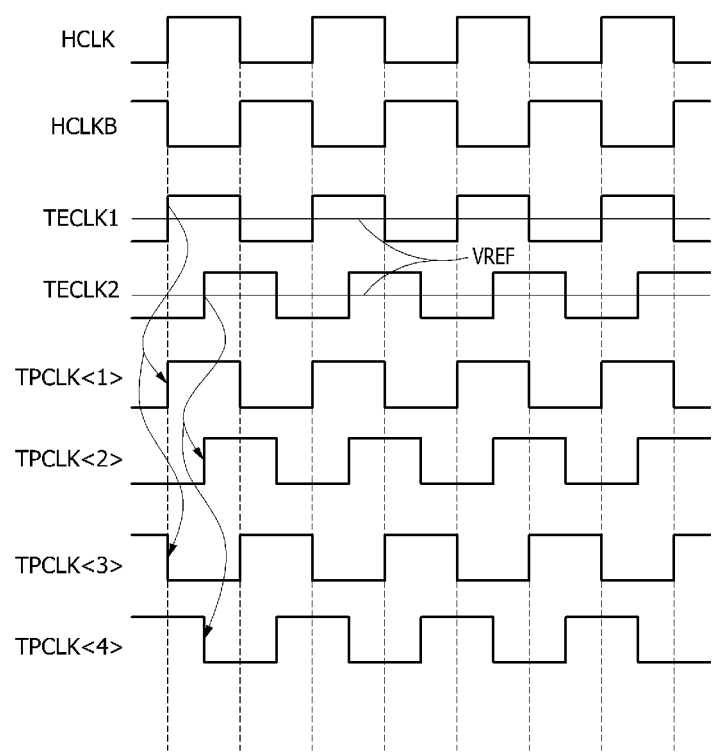
FIG. 6 is a timing diagram illustrating an operation of the test phase clock generator shown in FIG. 5.

FIG. 5 is a block diagram illustrating an example of the test phase clock generator included in the semiconductor system of FIG. 1, and FIG. 6 is a timing diagram illustrating an operation of the test phase clock generator shown in FIG. 5.

As illustrated in FIGS. 5 and 6, the test phase clock generator 3 may be configured to include a first test clock receiver 31 and a second test clock receiver 32. When the test mode signal TM is enabled, the first test clock receiver 31 may receive the first external test clock signal TECLK1 to generate the first and third test phase clock signals TPCLK<1> and TPCLK<3> according to a reference voltage signal VREF. When the test mode signal TM is enabled, the second test clock receiver 32 may receive the second external test clock signal TECLK2 to generate the second and fourth test phase clock signals TPCLK<2> and TPCLK<4> according to the reference voltage signal VREF. In some embodiments, each of the first and second test clock receivers 31 and 32 may be used a differential amplifier.

The operation of the test phase clock generator 3 will be described more fully hereinafter with reference again to FIG. 6.

Referring again to FIG. 6, the first test clock receiver 31 may generate the first test phase clock signal TPCLK<1> having a logic "high" level when the first external test clock signal TECLK1 has a higher level than the reference voltage signal VREF and may generate the first test phase clock signal TPCLK<1> having a logic "low" level when the first external test clock signal TECLK1 has a lower level than the reference voltage signal VREF. Further, the first test clock receiver 31 may generate the third test phase clock signal TPCLK<3> having a logic "low" level when the first external test clock signal TECLK1 has a higher level than the reference voltage signal VREF and may generate the third test phase clock signal TPCLK<3> having a logic "high" level when the first external test clock signal TECLK1 has a lower level than the reference voltage signal VREF.

The second test clock receiver 32 may generate the second test phase clock signal TPCLK<2> having a logic "high" level when the second external test clock signal TECLK2 has a higher level than the reference voltage signal VREF and may generate the second test phase clock signal TPCLK<2> having a logic "low" level when the second external test clock signal TECLK2 has a lower level than the reference voltage signal VREF. Further, the second test clock receiver 32 may generate the fourth test phase clock signal TPCLK<4> having a logic "low" level when the second external test clock signal TECLK2 has a higher level than the reference voltage signal VREF and may generate the third test phase clock signal TPCLK<4> having a logic "high" level when the second external test clock signal TECLK2 has a lower level than the reference voltage signal VREF. The first to fourth test phase clock signals TPCLK<1:4> generated from the second test clock receiver 32 may also have a phase difference of 90 degrees therebetween like the first to fourth phase clock signals PCLK<1:4>. That is, a phase of the second test phase clock signal TPCLK<2> may be 90 degrees later than that of the first test phase clock signal TPCLK<1>, a phase of the third test phase clock signal TPCLK<3> may be 90 degrees later than that of the second test phase clock signal TPCLK<2>, and a phase of the fourth test phase clock signal TPCLK<4> may be 90 degrees later than that of the third test phase clock signal TPCLK<3>.

As described above, the operation of the semiconductor system may be executed in the test mode or out of the test mode.

When the semiconductor system is out of the test mode, the phase clock generator 2 may receive the second external clock signal ECLK and the second inversed external clock signal ECLKB to generate the first to fourth phase clock signals PCLK<1:4> having different phases from each other. The first to fourth phase clock signals PCLK<1:4> may be selected and outputted as the first to fourth selection phase clock signals SPCLK<1:4> corresponding to the output signals of the multiplexer 4 and may be used in data I/O operation of the data I/O portion 16.

Meanwhile, when the semiconductor system is under the test mode, the test phase clock generator 3 may receive the first and second external test clock signals TECLK1 and TECLK2 to generate the first to fourth test phase clock signals TPCLK<1:4> having different phases from each other. The first to fourth test phase clock signals TPCLK<1:4> may be selected and outputted as the first to fourth selection phase clock signals SPCLK<1:4> corresponding to the output signals of the multiplexer 4 and may be used in the data I/O operation of the data I/O portion 16.

As described above, the semiconductor system according to the embodiments may provide a test mode operation that generates multi-phase clock signals, which are used in a data I/O operation, in response to the first and second external test clock signals TECLK1 and TECLK2. Thus, the semiconductor system according to the embodiments can generate the multi-phase clock signals without use of any phase locked loop (PLL) circuits, thereby lowering the power consumption of the semiconductor system and improving the integration density of the semiconductor chips in the semiconductor system. Further, the semiconductor system according to the embodiments may not require a locking time during a test mode operation. Thus, the test mode operation may be executed at a high speed.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor chip comprising:
   a selection phase clock generator configured to receive an external clock signal and an inversed external clock signal to generate phase clock signals, configured to receive a first external test clock signal and a second external test clock signal in response to a reference voltage having a constant level to generate test phase clock signals, and configured to output the phase clock signals or the test phase clock signals as selection phase clock signals in response to a test mode signal; and
   a data input/output portion configured to receive and output data in synchronization with the selection phase clock signals.

2. The semiconductor chip of claim 1, wherein the second external test clock signal has a phase difference of 90 degrees with respect to the first external test clock signal.

3. The semiconductor chip of claim 2, wherein the external clock signal has a frequency which is twice that of the first external test clock signal.

4. The semiconductor chip of claim 3, wherein the selection phase clock generator includes:
   a phase clock generator configured to receive the external clock signal and the inversed external clock signal to generate the phase clock signals in response to the test mode signal;
   a test phase clock generator configured to receive the first and second external test clock signals to generate the test phase clock signals in response to the test mode signal; and
   a multiplexer configured to output one of the phase clock signals and the test phase clock signals as the selection phase clock signals in response to the test mode signal.

5. The semiconductor chip of claim 4, wherein the multiplexer is configured to select the phase clock signals of the phase clock generator when the test mode signal is disabled out of a test mode.

6. The semiconductor chip of claim 4, wherein the multiplexer is configured to select the test phase clock signals of the test phase clock generator when the test mode signal is enabled under a test mode.

7. The semiconductor chip of claim 4, wherein the phase clock generator includes:
   a clock receiver configured to buffer the external clock signal and the inversed external clock signal to generate an internal clock signal and an inversed internal clock signal when the test mode signal is disabled; and
   a divider configured to divide frequencies of the internal clock signal and the inversed internal clock signal to generate the phase clock signals.

8. The semiconductor chip of claim 7:
   wherein the phase clock signals include a first phase clock signal, a second phase clock signal, a third phase clock signal and a fourth phase clock signal;
   wherein the divider is configured to generate the first to fourth phase clock signals having a period which is twice that of the internal clock signal and the inversed internal clock signal; and
   wherein a phase of the second phase clock signal is 90 degrees later than that of the first phase clock signal, a phase of the third phase clock signal is 90 degrees later than that of the second phase clock signal, and a phase of the fourth phase clock signal is 90 degrees later than that of the third phase clock signal.

9. The semiconductor chip of claim 7, wherein the phase clock signals include a first phase clock signal, a second phase clock signal, a third phase clock signal and a fourth phase clock signal, the divider includes:
a first latch portion configured to latch the first phase clock signal in synchronization with the inversed internal clock signal to output the second phase clock signal;
a first buffer configured to buffer and output an output signal of the first latch portion;
a second latch portion configured to latch an output signal of the first buffer in synchronization with the internal clock signal to output the first phase clock signal;
a third latch portion configured to latch the third phase clock signal in synchronization with the inversed internal clock signal to output the fourth phase clock signal;
a second buffer configured to buffer and output an output signal of the third latch portion; and
a fourth latch portion configured to latch an output signal of the second buffer in synchronization with the internal clock signal to output the third phase clock signal.

10. The semiconductor chip of claim 4, wherein the test phase clock signals includes a first test phase clock signal, a second test phase clock signal, a third test phase clock signal and a fourth test phase clock signal, the test phase clock generator includes:
a first test clock receiver configured to receive the first external test clock signal to generate the first test phase clock signal according to the reference voltage signal and configured to invert the first test phase clock signal to generate the third test phase clock signal; and
a second test clock receiver configured to receive the second external test clock signal to generate the second test phase clock signal according to the reference voltage signal and configured to invert the second test phase clock signal to generate the fourth test phase clock signal.

11. The semiconductor chip of claim 10:
wherein the first test phase clock signal has a phase difference of 90 degrees with respect to the second test phase clock signal;
wherein the third test phase clock signal has a phase difference of 90 degrees with respect to the fourth test phase clock signal; and
wherein the third test phase clock signal has a phase difference of 180 degrees with respect to the first test phase clock signal.

12. The semiconductor chip of claim 10, wherein each of the first and second test clock receivers is a differential amplifier.

13. A semiconductor system comprising:
a first semiconductor chip configured to generate a first external clock signal, a first inversed external clock signal, a second external clock signal, a second inversed external clock signal, a first external test clock signal and a second external test clock signal; and
a second semiconductor chip configured to generate selection phase clock signals in response to the first and second external test clock signals and a reference voltage having a constant level in a test mode and configured to receive and output data in synchronization with the selection phase clock signals,
wherein the second external test clock signal has the same frequency and phase as the first external clock signal and has a phase difference of 90 degrees with respect to the first external test clock signal.

14. The semiconductor system of claim 13, wherein the second external clock signal has a frequency which is twice that of the first external clock signal.

15. The semiconductor system of claim 14, wherein the second semiconductor chip configured to generate the selection phase clock signals in response to the second external clock signal and the second inversed external clock signal out of the test mode and configured to receive and output the data in synchronization with the selection phase clock signals.

16. The semiconductor system of claim 15, wherein the second semiconductor chip includes:
a selection phase clock generator configured to receive the second external clock signal and the second inversed external clock signal to generate phase clock signals, to receive the first external test clock signal and the second external test clock signal to generate test phase clock signals, and to output the phase clock signals or the test phase clock signals as the selection phase clock signals in response to a test mode signal; and
a data input/output portion configured to receive and output the data in synchronization with the selection phase clock signals.

17. The semiconductor system of claim 16, wherein the selection phase clock generator includes:
a phase clock generator configured to receive the second external clock signal and the second inversed external clock signal to generate the phase clock signals in response to the test mode signal;
a test phase clock generator configured to receive the first and second external test clock signals to generate the test phase clock signals in response to the test mode signal; and
a multiplexer configured to output one of the phase clock signals and the test phase clock signals as the selection phase clock signals in response to the test mode signal.

18. The semiconductor system of claim 17, wherein the multiplexer is configured to select the phase clock signals of the phase clock generator when the test mode signal is disabled out of a test mode.

19. The semiconductor system of claim 17, wherein the multiplexer is configured to select the test phase clock signals of the test phase clock generator when the test mode signal is enabled under a test mode.

20. The semiconductor system of claim 17, wherein the phase clock generator includes:
a clock receiver configured to buffer the second external clock signal and the second inversed external clock signal to generate an internal clock signal and an inversed internal clock signal when the test mode signal is disabled; and
a divider configured to divide frequencies of the internal clock signal and the inversed internal clock signal to generate the phase clock signals.

21. The semiconductor system of claim 20:
wherein the phase clock signals include a first phase clock signal, a second phase clock signal, a third phase clock signal and a fourth phase clock signal;
wherein the divider is configured to generate the first to fourth phase clock signals having a period which is twice that of the internal clock signal and the inversed internal clock signal; and
wherein a phase of the second phase clock signal is 90 degrees later than that of the first phase clock signal, a phase of the third phase clock signal is 90 degrees later than that of the second phase clock signal, and a phase of the fourth phase clock signal is 90 degrees later than that of the third phase clock signal.

22. The semiconductor system of claim 20, wherein the phase clock signals include a first phase clock signal, a second phase clock signal, a third phase clock signal and a fourth phase clock signal, the divider includes:
- a first latch portion configured to latch the first phase clock signal in synchronization with the inversed internal clock signal to output the second phase clock signal;
- a first buffer configured to buffer and output an output signal of the first latch portion;
- a second latch portion configured to latch an output signal of the first buffer in synchronization with the internal clock signal to output the first phase clock signal;
- a third latch portion configured to latch the third phase clock signal in synchronization with the inversed internal clock signal to output the fourth phase clock signal;
- a second buffer configured to buffer and output an output signal of the third latch portion; and
- a fourth latch portion configured to latch an output signal of the second buffer in synchronization with the internal clock signal to output the third phase clock signal.

23. The semiconductor system of claim 17, wherein the test phase clock signals includes a first test phase clock signal, a second test phase clock signal, a third test phase clock signal and a fourth test phase clock signal, the test phase clock generator includes:
- a first test clock receiver configured to receive the first external test clock signal to generate the first test phase clock signal according to the reference voltage signal and configured to invert the first test phase clock signal to generate the third test phase clock signal; and
- a second test clock receiver configured to receive the second external test clock signal to generate the second test phase clock signal according to the reference voltage signal and configured to invert the second test phase clock signal to generate the fourth test phase clock signal.

24. The semiconductor system of claim 23:
- wherein the first test phase clock signal has a phase difference of 90 degrees with respect to the second test phase clock signal;
- wherein the third test phase clock signal has a phase difference of 90 degrees with respect to the fourth test phase clock signal; and
- wherein the third test phase clock signal has a phase difference of 180 degrees with respect to the first test phase clock signal.

25. The semiconductor system of claim 23, wherein each of the first and second test clock receivers is a differential amplifier.

26. The semiconductor system of claim 16, wherein the second semiconductor chip further includes:
- a mode controller configured to receive the command signal and the address signal in synchronization with the first external clock signal and the first inversed external clock signal to generate a read signal, a write signal and a data control signal for controlling the data I/O portion; and
- a memory cell array portion configured to store the data therein in synchronization with the write signal or to output the data stored therein in synchronization with the read signal.

* * * * *